United States Patent
Yilmaz et al.

(10) Patent No.: US 8,952,509 B1
(45) Date of Patent: Feb. 10, 2015

(54) STACKED MULTI-CHIP BOTTOM SOURCE SEMICONDUCTOR DEVICE AND PREPARATION METHOD THEREOF

(71) Applicants: Hamza Yilmaz, Saratoga, CA (US); Yueh-Se Ho, Sunnyvale, CA (US); Yan Xun Xue, Los Gatos, CA (US); Jun Lu, San Jose, CA (US); Xiaotian Zhang, San Jose, CA (US); Zhi Qiang Niu, Santa Clara, CA (US); Ming-Chen Lu, Shanghai (CN); Liang Zhao, Shanghai (CN); YuPing Gong, Shanghai (CN); GuoFeng Lian, Shanghai (CN)

(72) Inventors: Hamza Yilmaz, Saratoga, CA (US); Yueh-Se Ho, Sunnyvale, CA (US); Yan Xun Xue, Los Gatos, CA (US); Jun Lu, San Jose, CA (US); Xiaotian Zhang, San Jose, CA (US); Zhi Qiang Niu, Santa Clara, CA (US); Ming-Chen Lu, Shanghai (CN); Liang Zhao, Shanghai (CN); YuPing Gong, Shanghai (CN); GuoFeng Lian, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 14/031,283

(22) Filed: Sep. 19, 2013

(51) Int. Cl.
*H01L 25/07* (2006.01)
*H01L 23/495* (2006.01)
*H01L 25/00* (2006.01)

(52) U.S. Cl.
CPC .......... *H01L 23/49575* (2013.01); *H01L 25/50* (2013.01)
USPC ............................................ 257/676; 438/123

(58) Field of Classification Search
USPC .......... 257/676, 723, 724, 778; 438/111, 112, 438/123
See application file for complete search history.

(56) References Cited

U.S. PATENT DOCUMENTS

2002/0105061 A1* 8/2002 Abe et al. ................... 257/666
2012/0313232 A1* 12/2012 Zhang et al. ................ 257/676

* cited by examiner

*Primary Examiner* — Daniel Shook
(74) *Attorney, Agent, or Firm* — Chein-Hwa Tsao; CH Emily LLC (57) ABSTRACT

The present invention discloses a stacked dual MOSFET package structure and a preparation method thereof. The stacked dual MOSFET package structure comprises a lead frame unit having a die paddle, a first lead and a second lead; a first chip flipped and attached on a top surface of a main paddle of the die paddle; a second chip attached on a bottom surface of the main paddle; and a metal clip mounted on the back of the flipped first chip and electrically connecting an electrode at the back of the first chip to the first lead. A top surface of a metal bump arranged on each electrode at the front of the second chip, a bottom surface of the die pin of the die paddle, a bottom surface of a lead pin of the second lead, and a bottom surface of the first lead are located on the same plane.

15 Claims, 7 Drawing Sheets

STACKED MULTI-CHIP BOTTOM SOURCE SEMICONDUCTOR DEVICE AND PREPARATION METHOD THEREOF

FIELD OF THE INVENTION

The present invention generally relates to a power semiconductor device and a preparation method thereof, and more particularly, to a stacked package containing multiple MOSFETs (Metal-Oxide-Semiconductor Field Effect Transistor) and a preparation method thereof.

DESCRIPTION OF THE RELATED ART

With the trend of reducing semiconductor device's size, the improvement of the heat dissipation and device performance are important. It is a challenge for semiconductor industry to reduce the size of a semiconductor package containing a maximum size semiconductor chip. Especially, for some packaging types with large power consumption, such as a DC-DC converter, N type high-side and low-side MOSFETs are packed in the same packaging body.

Figure 1:
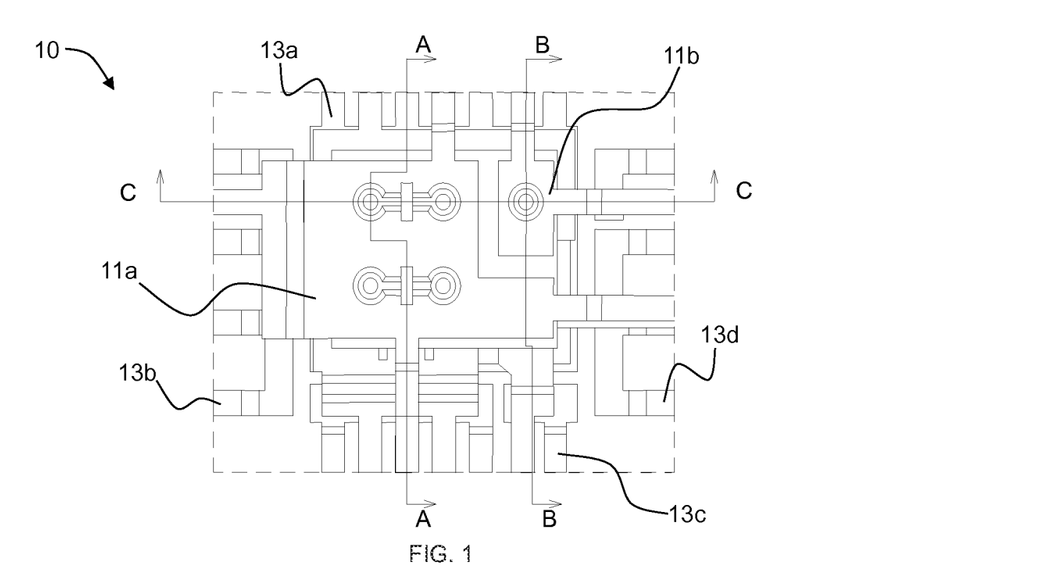
FIG. 1 and FIG. 2A to FIG. 2E are schematic diagrams of a conventional stacked semiconductor package.
Figure 2A:
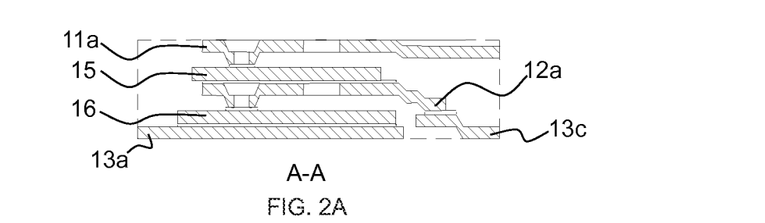
Figure 2B:
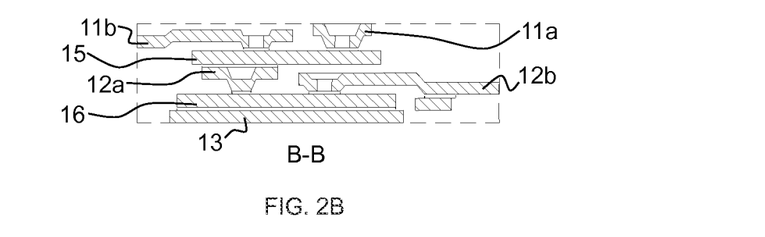
Figure 2C:
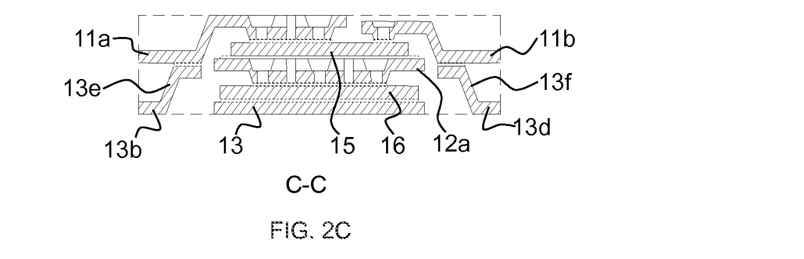
Figure 2D:
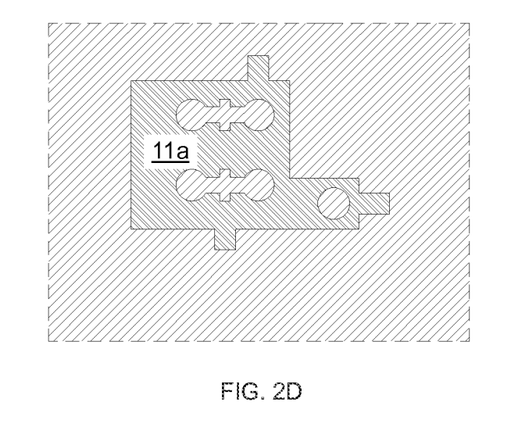
Figure 2E:
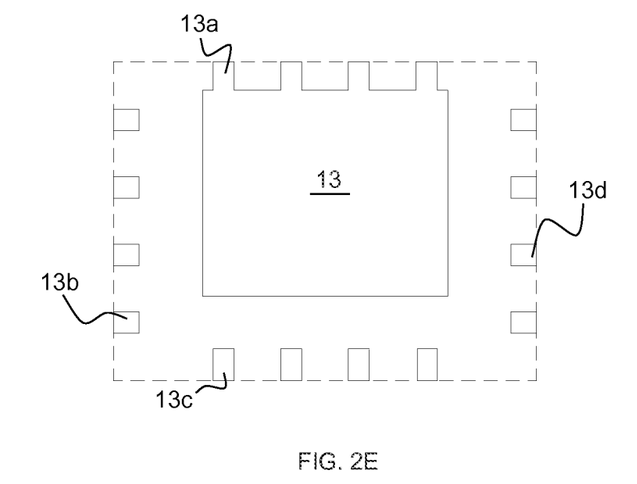

For instance, FIG. 1 and FIG. 2A-2E are schematic diagrams of a stacked double chip semiconductor package 10 of the Prior Art. FIG. 1 is a top view diagram of the semiconductor package 10. FIG. 2A is a cross-section diagram of the semiconductor package 10 along an A-A line in FIG. 1; FIG. 2B is a cross-section diagram of the semiconductor package 10 along a B-B line in FIG. 1; FIG. 2C is a cross-section diagram of the semiconductor package 10 along a C-C line in FIG. 1. As shown in FIGS. 2A-2C, top metal clips 11a and 11b are electrically connected with the electrodes at the front of a first chip 15 and can be used as a terminal as well as for heat dissipation. Metal clips 12a and 12b are located below the first chip 15 and are electrically connected with a portion of an electrode at the back of the first chip 15 and are further electrically connected with the electrodes at the front of a second chip 16. Furthermore, the electrode at the back of the second chip 16 is mounted on a metal clip 13 at the bottom of the stack, which is used as a terminal for connecting the electrode of the second chip 16 to an outside device and also used as a heat sink. As shown in FIG. 2E, which is a bottom view of the semiconductor package 10, pins 13a, 13b, 13c and 13d are distributed around the metal clip 13 with the pin 13a connected with the metal clip 13. As shown in FIG. 2C, pins 13b and 13d are connected with the metal clips 11a and 11b through extending parts 13e and 13f extending upwards and approximately close to metal clip 12a respectively. For the sake of simplicity, the bonding materials for connecting the electrodes of the first chip 15 and the metal clips 11a, 11b and 12a and for connecting the electrode of the second chip 16 with the metal clips 12a, 12b and 13a are not shown in FIG. 2A-2C.

In addition, the metal clip 11a is higher than the metal clip 11b, thus the top surfaces of the metal clip 11a and the metal clip 11b are not co-planar. Therefore, as shown in the top view of the semiconductor package 10 in FIG. 2D, the metal clip 11b is encapsulated inside the semiconductor package 10, but the top surface of the metal clip 11a is exposed outside the plastic package body of the semiconductor package 10. In FIG. 2B, the metal clip 12b is lower than the metal clip 12a to avoid the contact between the metal clip 12b and the back of the first chip 15.

The lead frame used in the conventional semiconductor package is complicated and includes a plurality of metal clips. Therefore, the manufacturing process of the conventional semiconductor package is difficult and the process reliability is extremely low, thus the final semiconductor package is also very large. Based on these problems, various embodiments provided in the invention are proposed.

BRIEF DESCRIPTIONS OF THE DRAWINGS

FIG. 3B-1 to FIG. 3H are perspective schematic diagrams illustrating the steps of a method of forming the stacked semiconductor package of FIG. 3A.

DETAILED DESCRIPTIONS OF THE PREFERRED EMBODIMENTS

Figures 1, 3B:
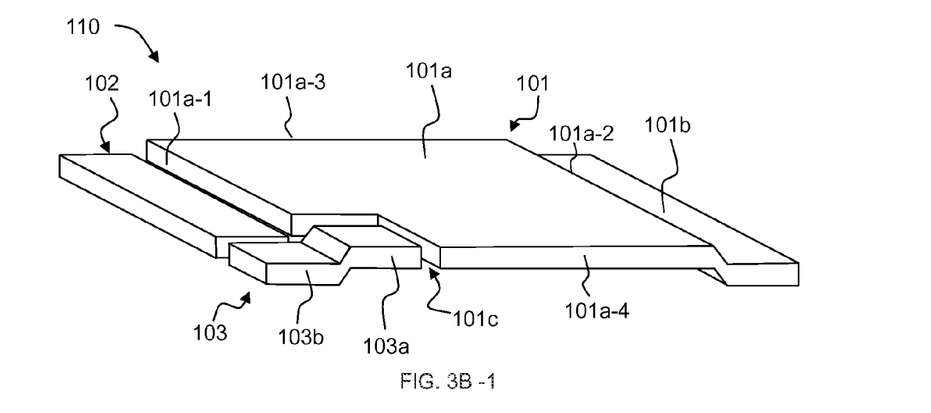
Figure 3A:
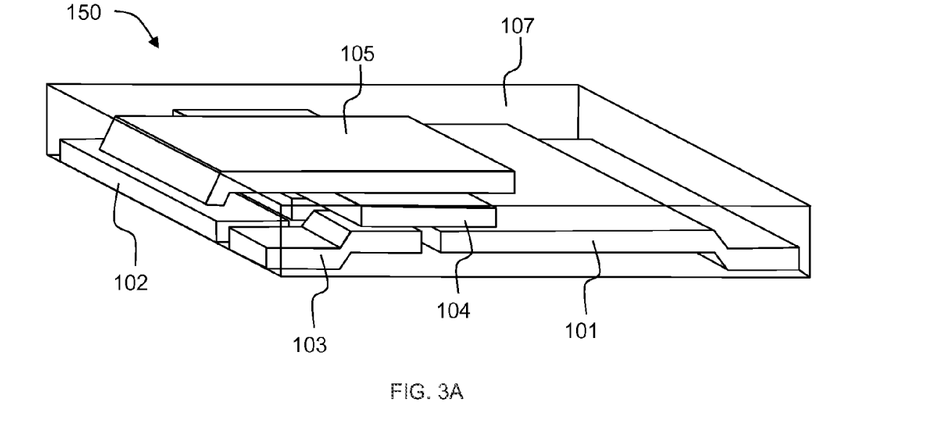
FIG. 3A is a perspective view of a stacked semiconductor package of the present invention.
Figure 3B:
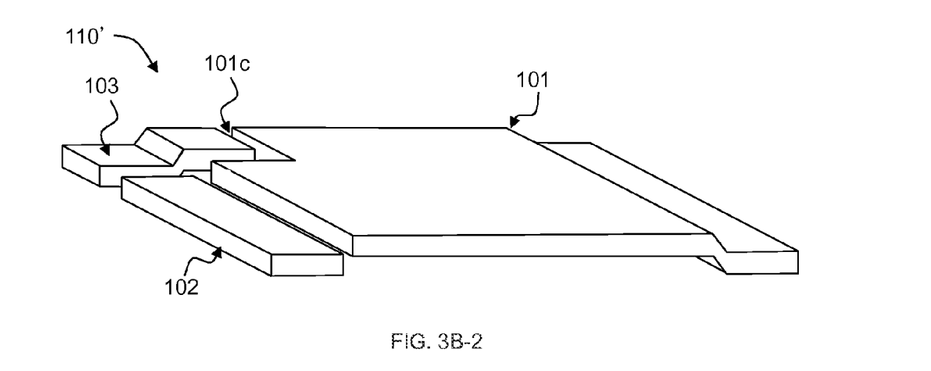

FIG. 3A is a perspective structural view of a stacked multi-chip semiconductor package 150. FIG. 3B-1 and FIG. 3B-2 are perspective views of two different configurations of a lead frame unit used in the semiconductor package 150. As shown in FIG. 3B-1 or FIG. 3B-2, a lead frame unit 110 or 110' comprises a die paddle 101, a first lead 102 and a second lead 103, which are separated from each other. A lead frame generally comprises a plurality of such lead frame units 110 or 110' connecting together by the connecting bars, where the die paddle 101, the first lead 102 and the second lead 103 of each lead frame unit 110 are connected to a support bar of the lead frame (not shown). The die paddle 101 comprises a main paddle 101a. The first lead 102 and the second lead 103 are arranged near the left edge (or the second edge) 101a-1 of the main paddle 101a. The die paddle 101 also includes a die pin 101b connected to and extends along the right edge (or the first edge opposite to the second edge) 101a-2 of the main paddle 101. The top surface of the main paddle 101a is higher than that of the die pin 101b. For the lead frame unit 110 shown in FIG. 3B-1, a rectangular notch 101c is formed at the corner of the left edge 101a-1 and the rear edge 101a-4 (or the third edge) of the main paddle 101a forming an L-shaped structure. Alternatively, as shown in FIG. 3B-2, in the lead frame unit 110', a rectangular notch 101c is formed at the corner of the left edge 101a-1 and the front edge 101a-3 of the main paddle 101a. In addition, the first lead 102 is closed to and extends along the left edge 101a-1 of the main paddle 101a. The second lead 103 includes a lead pin 103b and a connecting part 103a connected with each other, with the top surface of the connecting part 103a is higher than that of the lead pin 103b. The connecting part 103a is embedded into the notch 101c, where top surfaces of the connecting plate 103a and the main paddle 101a are co-planar, and the top surfaces of the first lead 102, the lead pin 103b and the die pin 101b are also co-planar.

Figure 3C:
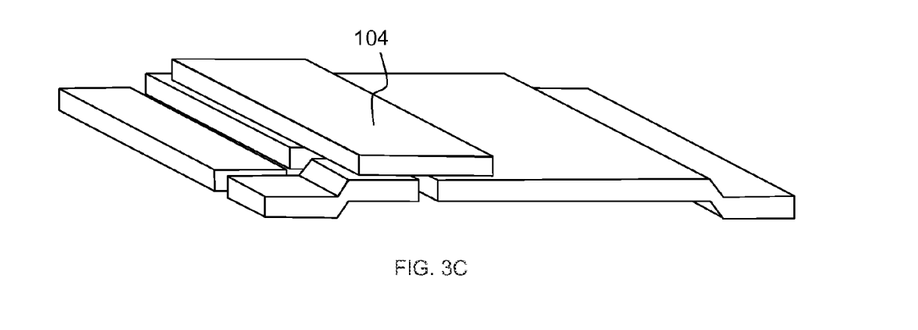
Figure 3D:
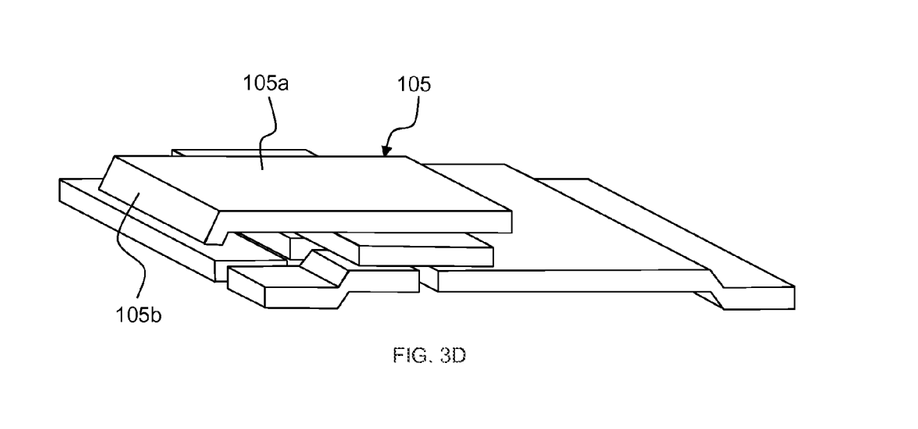

As shown in FIG. 3C, a first chip 104, for example a high-side MOSFET, is flipped and mounted on the top surface of the connecting part 103a and the main paddle 101a. In an embodiment, metal bump is deposited on each electrode at the front of the high-side MOSFET 104. To attach the flipped first chip 104 on the top surface of the connecting part 103a and the top surface of the main paddle 101a, a first conductive solder is firstly coated on the top surface of the connecting part 103a and the top surface of the main paddle 101a, then the metal bump deposited on the gate electrode is adhered on the connecting part 103a and the metal bump deposited on the source electrode is adhered on the main paddle 101a via the first conductive solder followed by the reflow soldering. In a preferred embodiment, a plastic packaging layer is formed to cover the front of the first chip 104 and surround the side wall of the metal bump arranged on the electrode at the front of the first chip 104 with the top of the metal bump exposed from the plastic packaging layer for electrically connecting the gate and the source electrodes with the top surface of the connecting part 103a and the top surface of the main paddle 101a accordingly, which is not shown in FIG. 3C but is described in detail in FIG. 4A to 4F. A metal layer is formed at the back of the first chip 104 functioning as the drain electrode (not shown). As shown in FIG. 3D, a metal clip 105 is mounted on the metal layer at the back of the first chip 104 and the top surface of the first lead 102. The metal clip 105 includes a horizontal plate 105a and a side portion 105b extending from one edge of the horizontal plate 105a and bending downward. Thus the electrode at the back of the first chip 104 is electrically connected with the horizontal plate 105a via a second conductive solder and the side portion 105b of the metal sheet 105 is connected to the top surface of the first lead 102 through the second conductive solder coated on the top surface of the first lead 102. Then a standard reflow soldering is applied.

Figure 3E:
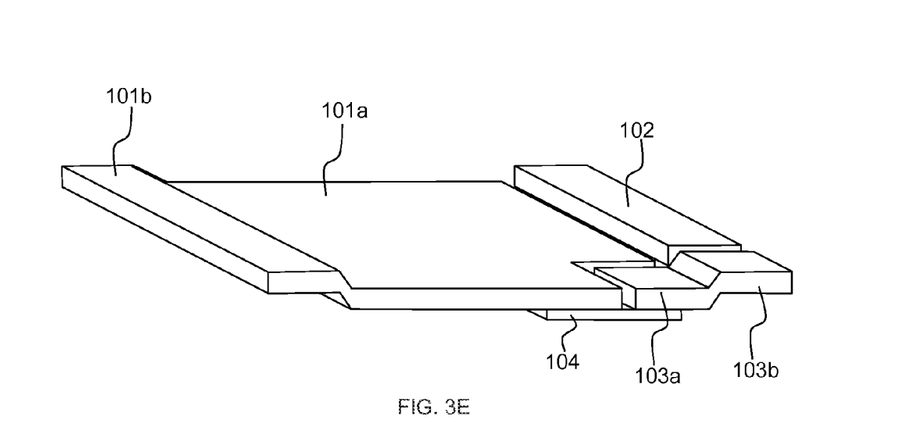
Figure 3F:
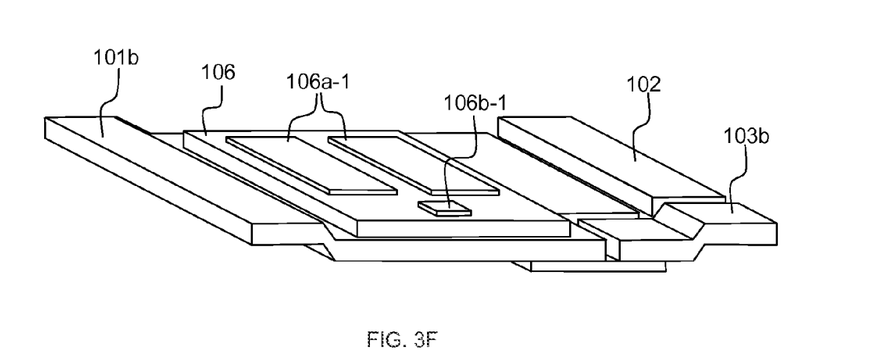

As shown in FIG. 3E to 3F, the lead frame unit 110 with the first chip 104 and the metal clip 105 attached thereon is flipped over with the bottom surface of the main paddle 101a facing upward (the bottom surface of the main paddle always keeps facing downward in the conventional process), and then a third conductive solder is coated on the bottom surface of the main paddle 101a of the die paddle for attaching a second chip 106 on the bottom surface of the main paddle 101a, for example a low-side N channel MOSFET. It is easy to understand that each lead frame unit 110 is flipped over by flipping the whole lead frame containing the lead frame units 110. In this step, the back of the second chip 106 is attached on the bottom surface of the main paddle 101a, thus the metal layer at the back of the second chip 106, functioning as the drain electrode, is electrically connected to the bottom surface of the main paddle 101a. The second chip 106 is placed far away from the notch 101c to prevent the electrode at the back of the second chip from electrically contacting with the connecting part 103a of the second lead 103 embedded into the notch 101c and to prevent the direct short circuit between the drain of the low-side MOSFET and the gate of the high-side MOSFET. Then, a standard reflow soldering is applied. Alternatively, the second chip 106 can be attached to the bottom surface of the main paddle 101a via a conductive adhesive. In this step, the top surface of the metal bumps (such as 106a-1 and 106b-1) formed on the electrodes (such as source and gate electrodes) at the front of the second chip 106, the bottom surface of the die pin 101b of the die paddle 101, the bottom surface 103b of the lead pin of the second lead 103 and the bottom surface of the first lead 102 are co-planar. The metal bump deposited on the gate electrode or the source electrode at the front of the high-side N-channel MOSFET and the low-side N-channel MOSFET is made of a soldering material or a non-soldering material, such as copper or other metal or alloy.

In an embodiment, the metal bumps deposited at the electrodes at the front of the first chip 104 are electrically connected with the main paddle 101a and the connecting part 103b through the first conductive solder of a first melting point. The horizontal plate 105a and the side portion 105b of the metal clip 105 are mounted on the electrode at the back of the first chip 104 and the first lead 102 respectively through the second conductive solder of a second melting point. The first melting point and the second melting point can be similar. In addition, the drain electrode at the back of the second chip 106 is electrically connected with the main paddle 101a through the third conductive solder of a third melting point coated at the bottom surface of the main paddle 101a. The first melting point and the second melting point need to be greater than the third melting point so that the reflow soldering for the third conductive solder of the third melting point coated on the bottom surface of the main paddle 101a will not affect the first conductive solder of the first melting point for attaching the first chip 104 on the connecting plate 103a of the second lead 103 and the main paddle 101a of the die paddle 101 and the second conductive solder of the second melting point for attaching the metal clip 105 on the first chip 104 and the first lead 102 to avoid the first and second conductive solders of the first and second melting points from melting that may result in loosening the contact between the first chip 104 and the metal clip 105, specially, when the lead frame unit 110 is flipped over.

Figure 3G:
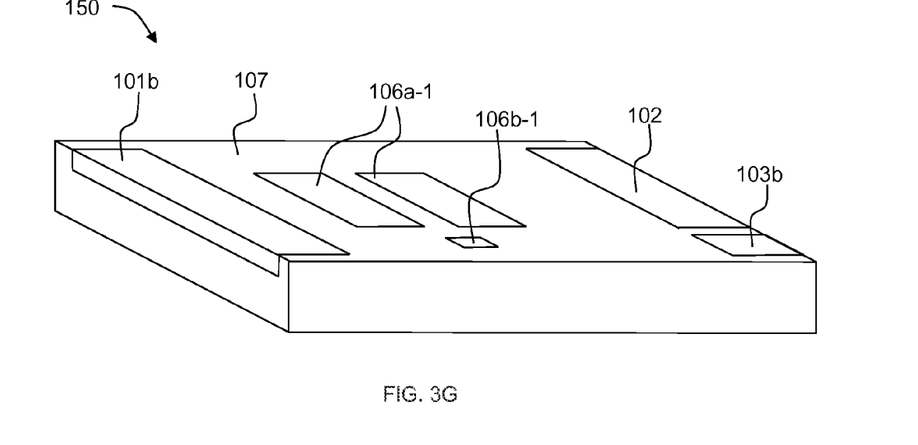

As shown in FIG. 3G, a plastic packaging body 107, made of plastic packaging material such as epoxy resin, is formed to cover the lead frame unit 110, the first chip 104, the second chip 106, the metal clip 105 and the metal bumps on the first and the second chips with the bottom surfaces of the die pin 101b and the lead pin 103b, the bottom surface of the first lead 102, the top surfaces of the metal bump 106a-1 and the metal bump 106b-1 on the gate and the source electrodes at the front of the second chip 106 being exposed from the bottom surface of the plastic package body 107. The steps of the plastic packaging process are as follows: forming a plastic packaging body of a plastic packaging material to cover each lead frame unit 110 on the lead frame, the first chip 104, the second chip 106 and the metal clip 105, the metal bumps on the chips; cutting the plastic packaging body and the lead frame to separate individual lead frame units 110 from the original lead frame (mainly cutting off the connecting bar among the die paddle, the first lead and the second lead and the support bar (not shown)) forming a plurality of individual semiconductor packages similar to package 150 in FIG. 3G. In a preferred embodiment, after the plastic packaging step, it further comprises a step of grinding on the bottom surface of the packaging body 107 to partially remove the plastic packaging material covering the top surfaces of the metal bump 106a-1 and the metal bump 106a-2 arranged on the electrodes at the front of the second chip 106, the bottom surfaces of the die pin 101b and the lead pin 103b, and the bottom surface of the first lead 102.

In the plastic packaging step, the metal clip 105 can be completely covered by the packaging body 107. Alternatively, the top surface of the horizontal plate 105b of the metal clip 105 can be exposed from the top surface of the packaging body 107 for improving the heat dissipation.

Figure 3H:
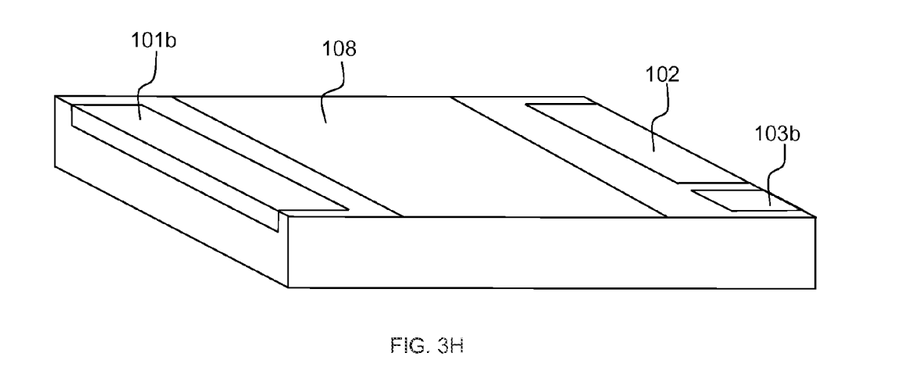

In an embodiment, after grinding, it further comprise a metalizing step on the exposed surfaces of the pins 101b and 103b and the first lead 102 as described followed. As shown in FIG. 3H, a protective film 108 is placed atop the plastic packaging body 107 to cover the exposed surface of the metal bump 106b-1 and the metal bump 106a-1 arranged on the gate and the source of the second chip 106, but not cover the exposed surface of the pins 101b and 103b and the first lead 102; then a metal protecting layer is plated on the un-covered surfaces of the pins 101b and 103b and the first lead 102 to prevent oxidation and improving the surface mount technology (SMT). For example, the exposed bottom surface and side surface of the pins 101b and 103b and the exposed bottom surface and side surface of the first lead 102 are covered with an electroplated coating, while the top surfaces of the metal bump 106b-1 and the metal bump 106a-1, made of soldering materials, are not covered with an electroplated coating by applying the protective film 108. Usually the protective film 108 can be removed after forming the metal protecting layer and the step of forming the metal protecting layer is performed before cutting the lead frame and the packaging body. In another embodiment, if the metal bump 106b-1 and the metal bump 106a-1 are made of the non-soldering materials, the electroplating process can be directly performed without the protective film 108 after grinding, thus the metal protecting layer is also formed on the exposed surfaces of the metal bump 106b-1 and the metal bump 106a-1.

Figure 4A:
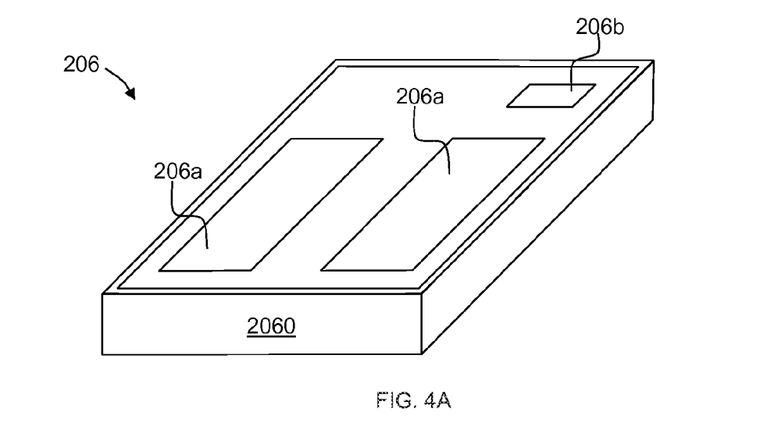
FIG. 4A to FIG. 4F are schematic diagrams illustrating the steps of a preparation process of forming a semiconductor chip used as the high-side chip or low-side chip in the semiconductor package of FIG. 3A.
Figure 4B:
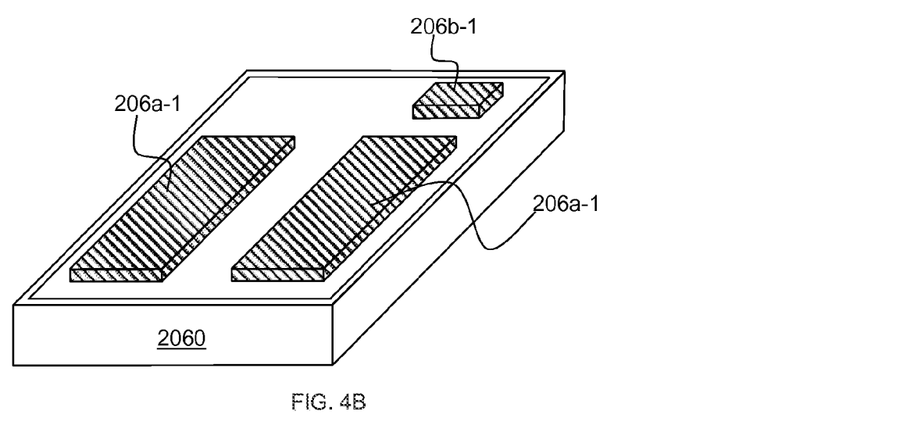

FIG. 4A and FIG. 4B are top views of a power semiconductor chip 206 such as a power MOSFET. The power chip 206 can be used as the first chip 104, a high-side power MOSFET, or the second chip 106, a low-side power MOSFET, as described above. When the power chip 206 is used as the first chip 104, a gate 206b and a source 206a are arranged at the front of each chip formed on a semiconductor wafer 2060, where the metal bump 206b-1 deposited on the gate 206b of the first chip 104, after the first chip 104 is flipped, is aligned with and attached on the connecting part 103b (FIG. 3C) and the gate 206b is arranged at one corner at the front of the chip on the wafer 2060 (the gate electrode of the second chip 106 has no such layout requirement). The metal bump 206a-1 deposited on the source 206a is aligned with and attached on the main paddle 101a. At this stage, a plastic packaging layer is not formed at the front of the wafer 2060.

Figure 4C:
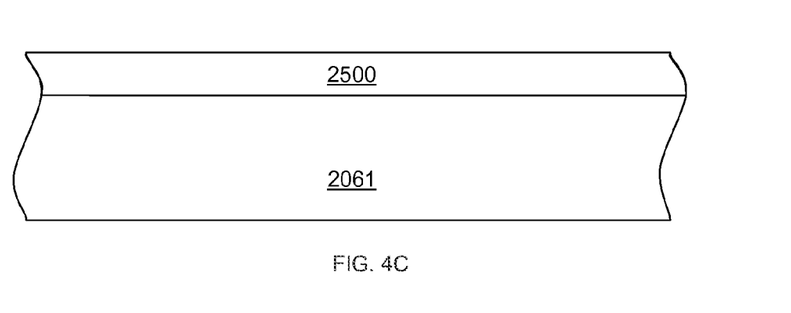
Figure 4D:
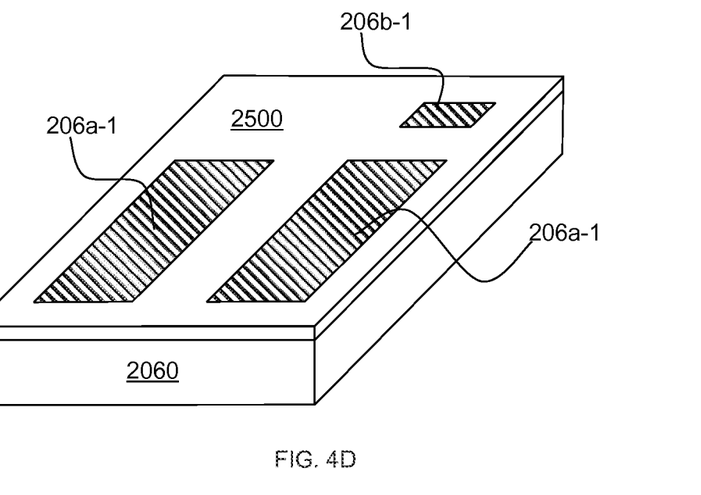
Figure 4E:
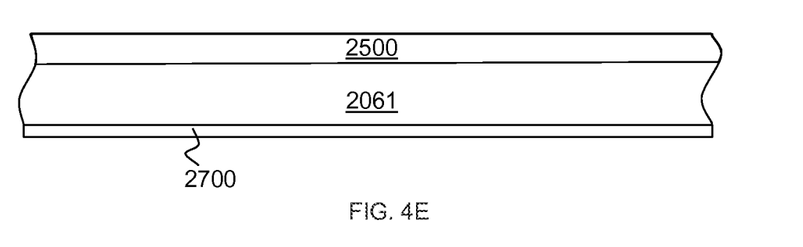
Figure 4F:
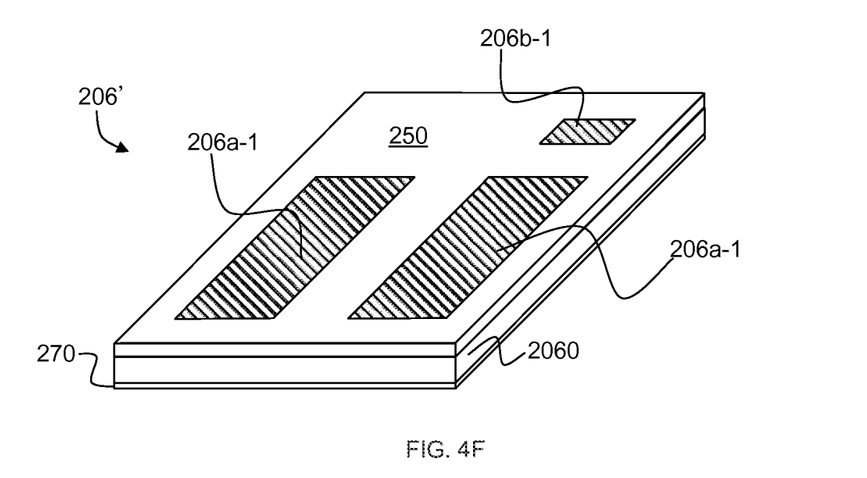

FIGS. 4C-4F are schematic diagrams illustrating the steps of forming a plastic packaging layer 250 at the front of the wafer 2060. As shown in FIG. 4C, a wafer 2061 generally includes a plurality of power chips 206 with the metal bumps (206a-1 and 206b-1) formed on the source and gate electrodes respectively at the front of each power chip 206 as shown in FIG. 4A and FIG. 4B and a plastic packaging layer 2500, made of the plastic packaging materials, is formed covering the front of the wafer 2061, thus covering each metal bump. The plastic packaging layer 2500 is then ground from the top to expose the metal bumps from the thinned plastic packaging layer 2500 as shown in FIG. 4D. At this stage, with the physical support of the plastic packaging layer 2500, the wafer 2061 can be ground as thin as possible from the back of the water to reduce the substrate resistance of the power MOSFET followed by the deposition of a metal layer 2700 at the back of the thinned wafer 2061 as shown in FIG. 4E. The wafer 2061, the plastic packaging layer 2500 and the metal layer 2700 are finally cut along the scribe line to form individual chip packages 206' as shown in FIG. 4F, each of which includes a power chip 2060, a plastic packaging layer 250 covering the front of each chip 2060 and surrounding the side wall of the metal bumps 206a-1 and 206b-1 with the top surface of the metal bumps 206a-1 and 206b-1 exposed from the plastic packaging layer 250, and a metal layer 270 at the back of each chip 2060 functioning as the drain electrode.

The power chip package 206' can be used as the first chip 104 or the second chip 106 as described above. When the chip package 206' is used as the first chip 104, the plastic packaging layer 250 covers the front of the first chip 104 and surrounds the side wall of the metal bumps of the first chip 104. Furthermore, in the power package 150, after the packaging step, the plastic packaging body 107 covers the first chip 104, the second chip 106, the metal bumps on the first and second chips and the metal clip 105, and further covers the plastic packaging layer 250. Similarly, when the chip package 206' is used as the second chip 106, the plastic packaging layer 250 covers the front of the second chip 106 and surrounds the side wall of the metal bumps on the second chip 106, and in a power package 150, the plastic packaging body 107 covers the first chip 104, the second chip 106, the metal bumps on the first and second chips and the metal clip 105 and further covers the plastic packaging layer 250 with the top surface of the plastic packaging layer 250 and the top surface of each metal bumps on the electrode of the second chip 106 exposed from the bottom surface of the packaging body 107.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A stacked multi-chip semiconductor device comprising:
a lead frame unit having a die paddle, a first lead and a second lead, which are separated from each other, wherein the die paddle consists of a main paddle and a die pin located on two different height horizontal planes;
a first chip flipped and attached on a top surface of the main paddle and a second chip attached on a bottom surface of the main paddle;
a metal clip electrically connecting an electrode at the back of the first chip to the first lead positioned proximity to the main paddle and coplanar with the die pin of the die paddle;
the second lead, positioned proximity to the main paddle, comprising a connecting part coplanar with the main paddle and electrically connecting to an electrode on the front of the first chip and a lead pin coplanar with the die pin of the die paddle;
wherein a top surface of a metal bump arranged on each electrode at the front of the second chip, a bottom surface of the die pin of the die paddle, a bottom surface of the lead pin of the second lead, and a bottom surface of the first lead are located on the same plane.

2. The semiconductor device of claim 1, wherein the die pin is connected to a first edge of the main paddle of the die paddle and the first lead is arranged along a second edge of the main paddle, the second edge is opposite with the first edge;
a notch is formed in a corner of the second edge and a third edge of the main paddle, wherein the connecting part of the second lead is embedded into the notch;
a plurality of electrodes on the front of the flipped first chip are electrically connected with the main paddle of the die paddle and the connecting part of the second lead accordingly;
the metal clip mounted on the flipped first chip consists of a horizontal plate attached on the electrode at the back of the first chip and a side portion bending downward and extending from one edge of the horizontal plate and contacting to the first lead; and
an electrode at the back of the second chip is electrically connected to the bottom surface of the main paddle through a conductive layer.

3. The semiconductor device of claim 2 further comprising a plastic packaging body covering the lead frame unit, the first chip, the second chip, the metal clip and the metal bump, wherein the bottom surfaces of the die pin of the die paddle and the lead pin of the second lead, the bottom surface of the first lead and the top surface of the metal bump arranged on each electrode at the front of the second chip are exposed from the bottom surface of the plastic packaging body.

4. The semiconductor device of claim 3, wherein a plastic packaging layer is formed at the front of the first chip to cover the front of the first chip and surround the side wall of the metal bump arranged on the electrode at the front of the first chip, wherein the metal bump is exposed from the plastic packaging layer for electrical connecting the electrode of the first chip to the top surface of the connecting part of the second lead and the top surface of the main paddle of the die paddle; and the plastic packaging layer is encapsulated inside the plastic packaging body.

5. The semiconductor device of claim 3, wherein a plastic packaging layer is formed at the front of the second chip to cover the front of the second chip and surround the side wall of the metal bump arranged on the electrode at the front of the second chip, wherein the top surface of the metal bump exposes from the plastic packaging layer; and the plastic packaging layer is encapsulated inside the plastic packaging body.

6. The semiconductor device of claim 3, wherein the top surface of the horizontal plate of the metal clip is exposed from the top surface of the plastic packaging body.

7. A preparation method of a stacked multi-chip semiconductor device comprising:

providing a lead frame unit having a die paddle, a first lead and a second lead, which are separated from each other, wherein the die paddle consists of a main paddle and a die pin located on two different height horizontal planes;

flipping and attaching a first chip on a top surface of the main paddle, wherein the second lead positioned close to the main paddle comprises a connecting part coplanar with the main paddle of the die paddle and a lead pin coplanar with the die pin of the die paddle, wherein an electrode on the front of the first chip is electrically connected to a top surface of the connecting part and another electrode on the front of the first chip is electrically connected to a top surface of the main paddle;

electrically connecting an electrode at the back of the first chip to the first lead coplanar with and positioned close to the main paddle of the die paddle via a metal clip;

flipping over the lead frame unit having the first chip and the metal clip attached thereon, and attaching a second chip on the bottom surface of the main die paddle;

wherein the top surface of a metal bump arranged on each electrode at the front of the second chip, the bottom surface of the die pin of the die paddle and the bottom surface of the lead pin of the second lead, and the bottom surface of the first lead are coplanar.

8. The method of claim 7, wherein a first edge of the main paddle is connected with the die pin and a second edge opposite with the first edge is arranged close to the first lead and the second lead;

wherein a notch is formed in a corner of the second edge and a third edge of the main paddle close to the first lead and the second lead, wherein the connecting part of the second lead is embedded inside the notch;

the metal bumps deposited on the electrodes on the front of the flipped first chip are respectively electrically connected with the top surface of the main paddle of the die paddle and the top surface of the connecting part of the second lead via a first conductive solder;

a horizontal plate of the metal clip is mounted on the electrode at the back of the first chip and a side portion of the metal clip bending downward is mounted on the first lead via a second conductive solder;

the second chip is attached on the bottom surface of the main paddle, so that an electrode at the back of the second chip is electrically connected with the main paddle via a third conductive solder.

9. The method of claim 8, wherein the metal bumps deposited on the electrodes at the front of the first chip are attached on the top surface of the main paddle of the die paddle and the top surface of the connecting part via the first conductive solder of a first melting point;

the metal clip is mounted on the electrode at the back of the first chip and the first lead via the second conductive solder of a second melting point;

the electrode at the back of the second chip is electrically connected with the main die paddle via the third conductive solder of a third melting point, wherein the first melting point and the second melting point are higher than the third melting point.

10. The method of claim 8, further comprising a step of forming a plastic packaging body covering the lead frame unit, the first chip, the second chip, the metal clip and each metal bump with the bottom surfaces of the die pin of the die paddle and the lead pin of the second lead, the bottom surface of the first lead and the top surface of the metal bump formed on each electrode at the front of the second chip exposed from the bottom surface of the plastic packaging body.

11. The method of claim 10, wherein a plastic packaging layer is formed at the front of the first chip to cover the front of the first chip and surround the side wall of the metal bump arranged on the electrode at the front of the first chip with the top of the metal bump exposing from the plastic packaging layer for electrically connecting the electrode of the flipped first chip on the top surface of the connecting part of the second lead and the top surface of the main paddle of the die paddle; and the plastic packaging layer is encapsulated inside the plastic packaging body in the step of forming the plastic packaging body.

12. The method of claim 10, wherein a plastic packaging layer is formed at the front of the second chip to cover the front of the second ship and surround the side wall of the metal bump arranged on the electrode at the front of the second chip with the top surface of the metal bump exposed from the plastic packaging layer;

the plastic packaging layer is encapsulated inside the plastic packaging body in the step of forming the plastic packaging body.

13. The method of claim 10, further comprising a step of depositing a protective film at the bottom surface of the plastic packaging body to cover the exposed top surface of the metal bump arranged on each electrode at the front of the second chip, but not cover the exposed bottom surfaces of the die pin of the die paddle and the lead pin of the second lead and the exposed bottom surface of the first lead; and plating a metal protective layer on the exposed surface of the die paddle, the first lead and the second lead not covered by the protective film.

14. The method of claim 10, further comprising a step of grinding from the bottom surface of the plastic packaging body to partially remove the plastic packaging material covering on the top surface of the metal bump arranged on each electrode at the front of the second chip, the bottom surface of the die pin of the die paddle and the lead pin of the second lead, and the bottom surface of the first lead.

15. The method of claim 7, wherein the metal bumps deposited on the electrodes at the front of the first chip are attached on the top surface of the main paddle of the die paddle and the top surface of the connecting part via the first conductive solder;

the metal clip is mounted on the electrode at the back of the first chip and the first lead via the second conductive solder; and the electrode at the back of the second chip is electrically connected with the main die paddle via a conductive adhesive.

\* \* \* \* \*